(12) United States Patent
Satz

(10) Patent No.: US 9,606,196 B2
(45) Date of Patent: *Mar. 28, 2017

(54) INTELLIGENT FIELD SHAPING FOR MAGNETIC SPEED SENSORS

(71) Applicant: Infineon Technologies AG, Neubiberg (DE)

(72) Inventor: Armin Satz, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/067,600

(22) Filed: Mar. 11, 2016

(65) Prior Publication Data

US 2016/0195592 A1 Jul. 7, 2016

Related U.S. Application Data

(63) Continuation of application No. 13/653,611, filed on Oct. 17, 2012, now Pat. No. 9,316,663.

(51) Int. Cl.
*G01P 3/48* (2006.01)
*G01B 7/30* (2006.01)
*G01R 33/09* (2006.01)
*G01P 3/488* (2006.01)
*G01R 33/00* (2006.01)
*G01D 11/24* (2006.01)
*G01P 3/487* (2006.01)
*G01D 5/14* (2006.01)

(52) U.S. Cl.
CPC .......... *G01R 33/091* (2013.01); *G01P 3/488* (2013.01); *G01R 33/0011* (2013.01); *G01R 33/09* (2013.01); *G01D 5/145* (2013.01); *G01D 11/245* (2013.01); *G01P 3/487* (2013.01)

(58) Field of Classification Search
CPC .. G01R 33/0011; G01D 11/245; G01D 5/145; G01P 3/487
USPC ............................................ 324/207.25, 166
See application file for complete search history.

(56) References Cited

U.S. PATENT DOCUMENTS

| 8,058,870 B2 | 11/2011 | Sterling |
| 2010/0188078 A1 | 7/2010 | Foletto et al. |
| 2010/0244607 A1 | 9/2010 | Fujimoto et al. |
| 2011/0068779 A1 | 3/2011 | Werth et al. |

(Continued)

OTHER PUBLICATIONS

Non-Final Office Action dated Sep. 4, 2014 for U.S. Appl. No. 13/653,611.

(Continued)

*Primary Examiner* — Reena Aurora
(74) *Attorney, Agent, or Firm* — Eschweiler & Potashnik, LLC

(57) ABSTRACT

The present disclosure provides for techniques to improve the sensitivity of magnetic sensor systems. One embodiment of a magnetic sensor system includes a magnetic biasing body comprised of a hard magnetic material and including a recess therein. The recess corresponds to a magnetic flux guidance surface of the magnetic biasing body. The magnetic sensor system also includes a magnetic sensing element arranged in or proximate to the recess. A magnetic flux concentrator, which is made of a soft magnetic material, is disposed in the recess between the magnetic flux guidance surface and the magnetic sensing element. Other techniques are also described.

20 Claims, 7 Drawing Sheets

(56) References Cited

U.S. PATENT DOCUMENTS

2011/0187359 A1    8/2011  Werth et al.
2013/0278246 A1   10/2013  Stegerer et al.
2014/0103915 A1*   4/2014  Satz .................. G01R 33/0011
                                                        324/207.25

OTHER PUBLICATIONS

Non-Final Office Action dated Mar. 12, 2015 for U.S. Appl. No. 13/653,611.
Final Office Action dated Oct. 7, 2015 for U.S. Appl. No. 13/653,611.
Notice of Allowance dated Dec. 17, 2015 for U.S. Appl. No. 13/653,611.

* cited by examiner

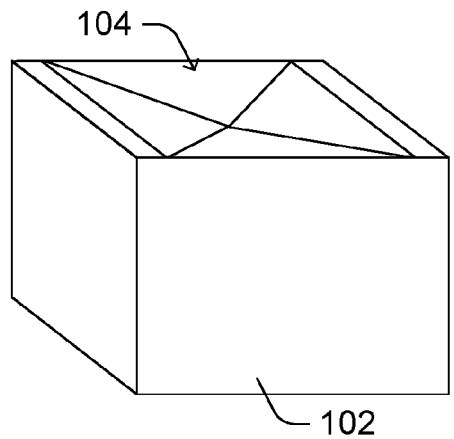
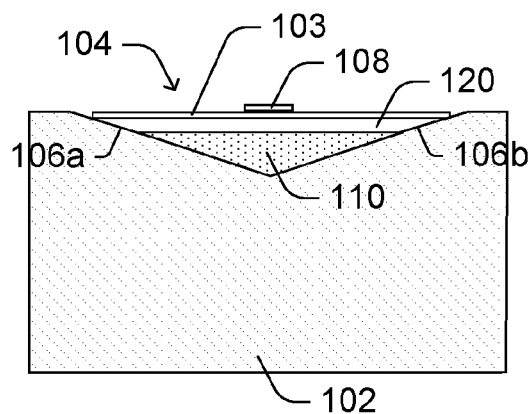
FIG. 4A  FIG. 4B
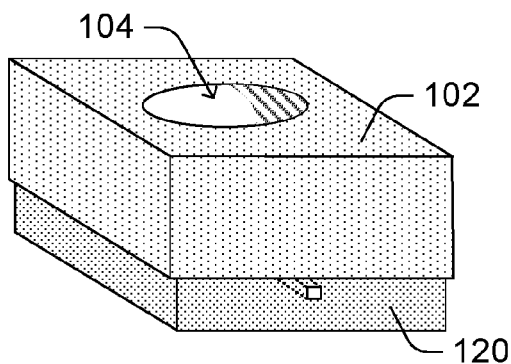
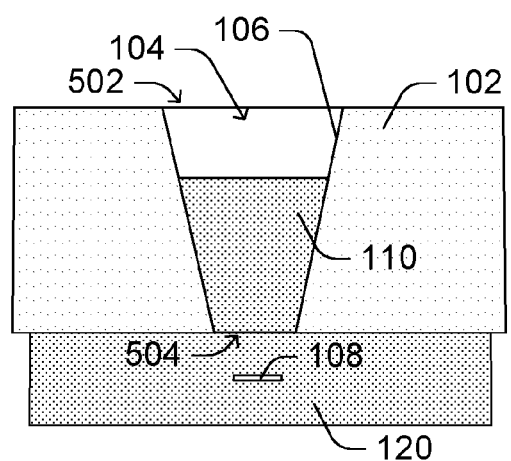
FIG. 5A  FIG. 5B

INTELLIGENT FIELD SHAPING FOR MAGNETIC SPEED SENSORS

REFERENCE TO RELATED APPLICATION

This Application is a Continuation of U.S. application Ser. No. 13/653,611 filed on Oct. 17, 2012, the contents of which is incorporated by reference in its entirety.

BACKGROUND

In many applications, it is useful to detect changes in magnetic field to track translational motion, rotational motion, proximity, speed and the like. GMR (Giant Magnetoresistance), AMR (Anisotropic Magnetoresistance), TMR (Magneto Tunnel Effect), and CMR (Colossal Magnetoresistance) sensors, as well as Hall-effect sensors, are different types of magnetoresistive sensors that can measure changes in magnetic field.

Typically, a magnetoresistive sensor has a high sensitivity in a so-called "working range" of the sensor. In this context, "high sensitivity" means that a small change in magnetic field applied to the sensor leads to a large change in resistance as measured by the sensor. Outside of the working range, unfavorable behavior of the magnetoresistive effect, such as saturation for example, limits the use of the sensor for many applications. Although existing magnetoresistive sensor systems are adequate in many respects, existing sensor systems suffer from a limitation in they have been unable to maximize the sensitivity and/or working range of the sensors.

SUMMARY

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The present disclosure provides for techniques to improve the sensitivity of magnetic sensor systems. One embodiment of a magnetic sensor system includes a magnetic biasing body comprised of a hard magnetic material and including a recess therein. The recess corresponds to a magnetic flux guidance surface of the magnetic biasing body. The magnetic sensor system also includes a magnetic sensing element arranged in or proximate to the recess. A magnetic flux concentrator, which is made of a soft magnetic material, is disposed in the recess between the magnetic flux guidance surface and the magnetic sensing element.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIGS. 4A and 4B show a three-dimensional depiction and a cross-sectional depiction, respectively, of a magnetoresistive sensor having a pyramidal flux guidance surface in accordance with some embodiments.

FIGS. 5A and 5B show a three-dimensional depiction and a cross-sectional depiction, respectively, of a magnetoresistive sensor having a conical flux guidance surface in accordance with some embodiments.

DETAILED DESCRIPTION

Figure 1:
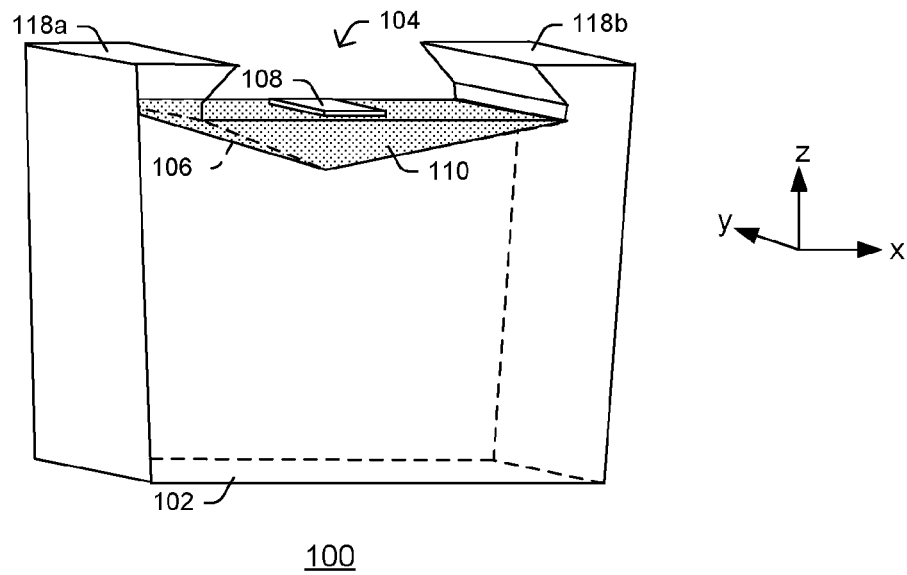
FIG. 1 shows a three-dimensional depiction of a magnetoresistive sensor that includes a magnetic flux concentrator in accordance with one embodiment.

The present invention will now be described with reference to the drawings wherein like reference numerals are used to refer to like elements throughout, and wherein the illustrated structures are not necessarily drawn to scale. Nothing in this detailed description (or drawings included herewith) is admitted as prior art.

FIG. 1 shows a perspective view of a magnetic sensing device 100 in accordance with some embodiments. The magnetic sensing device 100 includes a back bias magnet 102 having a recess 104 therein. The recess 104 corresponds to a flux-guidance surface 106, which is illustrated as being comprised of four planar surfaces that form an inverted pyramidal in shape in FIG. 1. A magnetic sensing element 108 is arranged proximate to the flux-guidance surface 106 to sense the magnetic field induced by the back bias magnet 102 and other nearby magnets. Crane-like protrusions 118a, 118b can also extend upward from two or more sides of the back bias magnet 102.

The magnetic sensing element 108 may comprise a semiconductor chip having at least one magnetoresistive or Hall sensor element provided thereon. The magnetic sensing element 108 may be a GMR, MTR, CMR, AMR element or any other form of magnetoresistive sensor element. In some embodiments, the magnetic sensing element 108 may have two sensing elements provided in a gradiometer arrangement, and/or may supply a differential signal from at least two sensing elements therein. In some embodiments, the magnetic sensing element 108 includes a plurality of magnetoresistive sensing elements arranged in a Wheatstone bridge configuration. Whatever the particular sensor configuration, the magnetic sensing element 108 is sensitive to changes in magnetic field in the x and/or y directions, which may be herein referred to as lateral components of the magnetic field. In contrast, the magnetic sensing element 108 is generally unaffected by magnetic field changes in the z-direction, which may be herein referred to as a vertical component of the magnetic field.

To provide a larger amplitude swing for the magnetic sensing element 108 relative to existing implementations, the magnetic sensing device 100 includes a magnetic flux concentrator 110. The magnetic flux concentrator 110 is arranged between magnetic sensing element 108 and flux guidance surface 106.

In some embodiments, the magnetic flux concentrator 110 extends continuously between flux guidance surface 106 and magnetic sensing element 108 (e.g., completely fills recess below magnetic sensing element 108). However, in other implementations, the magnetic flux concentrator can also be spaced apart from the flux-guidance surface 106 and/or sensing element 108 (e.g., only partially fills recess below magnetic sensing element 108).

In some embodiments the magnetic flux concentrator 110 is a soft magnetic material, while the back bias magnet 102 is a hard or permanent magnetic material. In other embodiments, the magnetic flux concentrator 110 and back bias magnet 102 are both hard magnetic materials or are both soft magnetic materials. Although the terms "hard" and "soft" are relative terms, it will be appreciated that a "hard" magnetic material is difficult to magnetize relative to a "soft" magnetic material. In a similar manner, the hard magnetic material is difficult to de-magnetize relative to a "soft" magnetic material. Hence, hard magnetic materials are well suited for permanent or long-lasting magnets, and soft magnetic materials are only transiently magnetized. "Hard" magnetic materials have high coercivity, whereas "soft" magnetic materials have low coercivity. Examples of soft ferromagnetic materials include but are not limited to: annealed iron, low carbon steel and plastically molded iron particles. Examples of hard ferromagnetic materials include, but are not limited to: alnico, ferrite, and rare earth magnets.

Figure 2:
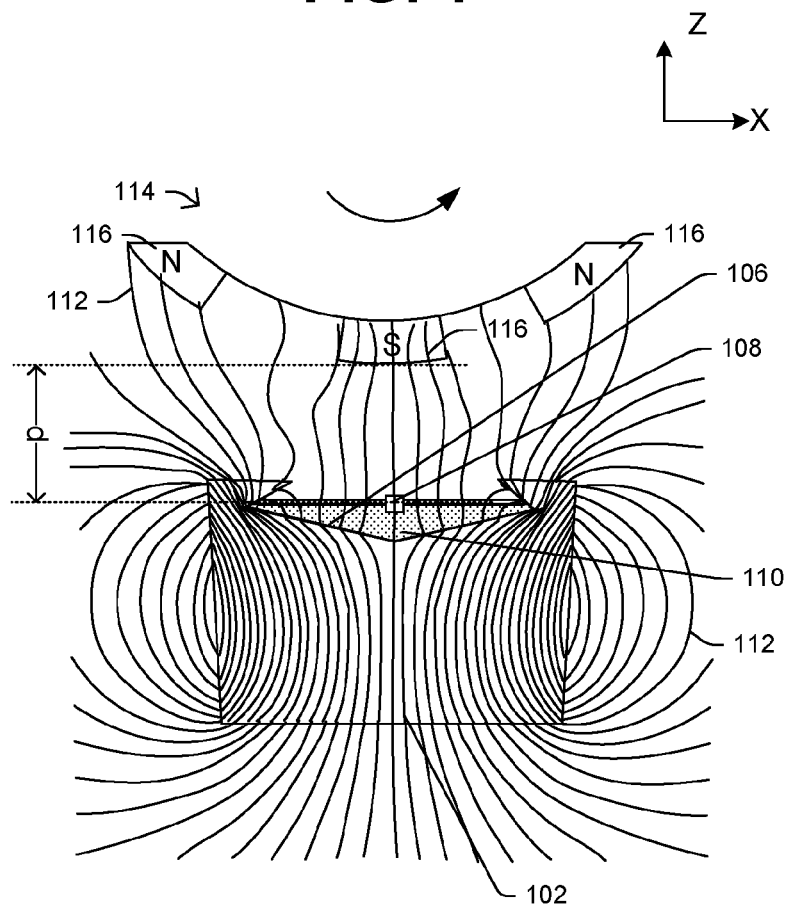
FIG. 2 depicts a cross-sectional view of FIG. 1's magnetoresistive sensor with magnetic field lines superimposed thereon.

As shown in FIG. 2, the flux guidance surface 106 guides magnetic field lines 112 so that, absent other magnetic fields, the magnetic field lines 112 are substantially aligned with the z-axis at the magnetic sensing element 108. The magnetic flux concentrator 110 can induce some additional "bend" to the magnetic field lines 112. Because the magnetic sensing element 108 is sensitive only to x- and/or y-component changes in the magnetic field, the flux guidance surface 106 in combination with the magnetic flux concentrator 110 facilitates the magnetic sensing element 108 switching between a magnetically unsaturated state (neutral resistance when magnetic field lines are aligned to z-axis as shown in FIG. 2) and a magnetically saturated state (high or low resistance when magnetic field lines are "twinged" to have x- or y-components at the magnetic sensing element 108).

For example, as shown in FIG. 2, when a rotary element 114 having a plurality of magnets 116 with alternating magnetization arranged around its outer circumference, rotates about its central axis; the resultant magnetic field lines 112 due to the magnets 116 correspondingly rotate to change the magnetic field signal detected by the magnetic sensing element 108. At the angular position illustrated in FIG. 2, for example, the magnetic field lines at the magnetic sensing element 108 are aligned to the z-axis. Because the magnetic sensing element 108 is sensitive to magnetic field components only along the x-axis and/or y-axis, this angular position results in the magnetic sensing element 108 recording a low amplitude (e.g., near-zero magnitude) magnetic field signal. As the rotary element 114 rotates, however, the magnetic field lines 112 are "twisted" so the magnetic sensing element 108 sees a non-zero magnetic x-component and/or y-component. By tracking the time-dependent magnetic field as the rotary element 114 rotates about its axis, the magnetic sensing element 108 can provide an output signal whose amplitude is indicative of the angular position of the rotary element 114.

Ideally, the change in amplitude between the various angular positions is as large as possible, as this helps to provide better angular measurement capabilities. Because magnetic field magnitude decreases with distance from a magnet, the inventors have appreciated that magnetic sensing elements in previous approaches, which included only an air gap and not magnetic flux concentrator 110, were unduly far from the magnets 116. In FIG. 2's embodiment, the magnetic flux concentrator 110 causes the magnetic field lines 112 to exhibit some additional "curvature" or "twinge" relative to a simple air gap, such that the distance d between sensor 108 and magnets 116 is less than that of previous implementations while still limiting offset drift. In this way, FIG. 2's magnetic sensing element 108 is able to experience a greater amplitude swing with smaller offset drift than previously achievable. Thus, due to the magnetic flux concentrator 110, the overall amplitude swing measured by the magnetic sensing element 108 is greater than previously achievable, which enables more accurate magnetic field measurements by limiting saturation more than previous approaches.

Figure 3A:
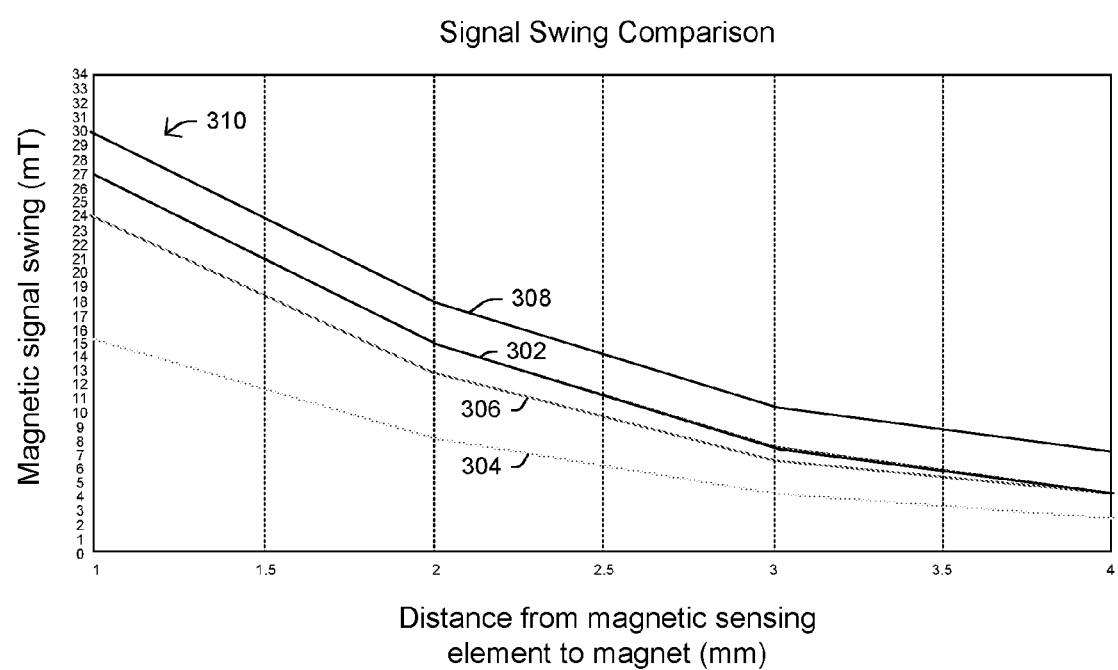
FIG. 3A shows a chart illustrating magnetic swing signal amplitude as a function of distance between a magnetic sensor and a magnet for various magnetic sensor arrangements.

FIG. 3A shows a series of curves illustrating the magnetic signal swing for various magnetic sensor arrangements. For example, curve 302 shows an existing implementation where a magnetic sensing element is arranged over a rare-earth back bias magnet with only an air gap therebetween (i.e., no magnetic flux concentrator is included). As shown, as the distance between the magnetic sensing element and the back bias magnet is decreased in region 310, the signal swing tends to increase. This curve 302 for the rare-earth element back bias magnet represents good performance relative to an implementation represented by curve 304 where an air gap separates a ferrite back bias magnet from a magnetic sensing element. Unfortunately, although the rare-earth back bias magnet of curve 302 provides fairly good performance, it is expensive due to the scarcity of rare-earth materials.

Curve 306 represents the signal swing performance when a magnetic flux concentrator (instead of a simple air gap) is inserted between a ferrite back bias magnet and a magnetic sensor, such as previously illustrated in FIG. 1 for example. Because ferrite is relatively inexpensive, such a solution is relatively cheap compared to a sensor system where a rare earth magnet is used. Further, as can be seen from curve 306, this solution also offers a fairly large signal swing. Thus, this solution offers particularly good tradeoffs between cost and performance. Further, if cost is not a concern, a flux concentrator can be used with a rare-earth magnet (see e.g., curve 308) to achieve extremely high performance.

Figure 3B:
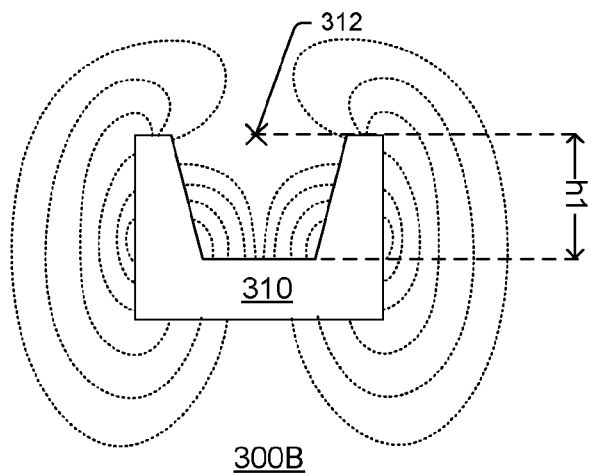
FIGS. 3B-3D show three different magnetic sensing configurations 300B-300D, respectively, illustrating various tradeoffs.
Figure 3C:
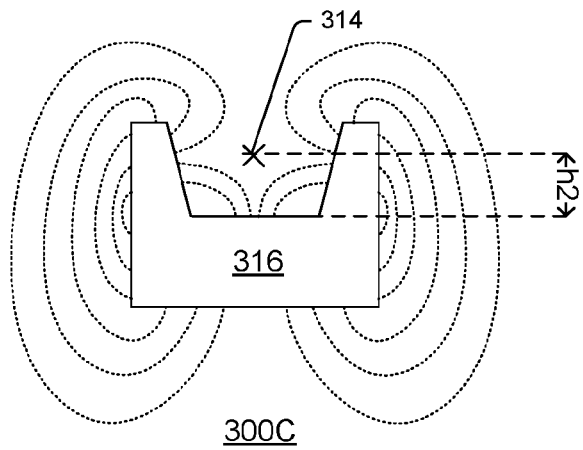
Figure 3D:
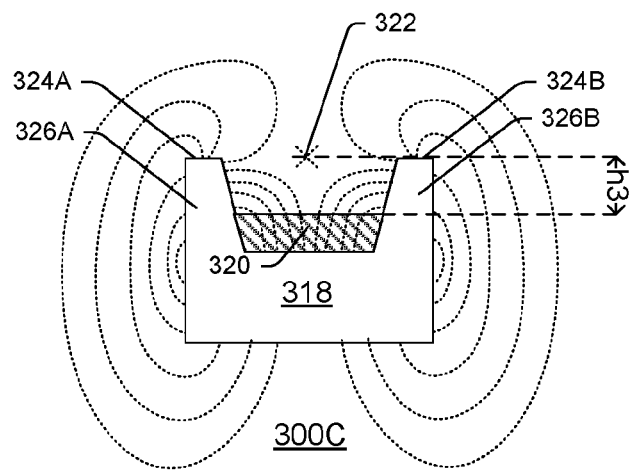

FIGS. 3B-3D show three different magnetic sensing configurations 300B-300D, respectively, illustrating various tradeoffs. The first magnetic sensing configuration 300B (FIG. 3B) shows an example where a back-bias magnet 310 is spaced apart from a zero-magnetic field location 312 by a height $h_1$, representing a "deep" cavity in the back bias magnet 310. Because this zero-magnetic field location 312 is where the biggest magnetic signal swings occur, a magnetic sensor (not shown) can be positioned at this zero-magnetic field location 312 to detect changes in magnetic field (e.g., due to a magnetic wheel).

In FIG. 3C's magnetic sensing configuration 300C, the cavity depth has been reduced to $h_2$ ($h_2 < h_1$), such that the non-zero magnetic field location 314 is positioned deeper in the cavity within back-bias magnet 316, relative to FIG. 3B's magnetic sensing configuration. Because the cavity depth is more "shallow" in FIG. 3C, the magnetic signal swings in the x- and/or y-directions at the zero-magnetic field location 314 will tend to be larger than in FIG. 3B's example, which promotes reliable detection of changes in magnetic field. Unfortunately, because the zero-magnetic field location 314 is located within the cavity, it is more difficult to get a magnetic field sensor positioned reliably at this location compared to FIG. 3B's embodiment.

FIG. 3D depicts a particularly advantageous magnetic sensing configuration 300D having a back-bias magnet 318 with a cavity, wherein a magnetic flux concentrator 320 is positioned in the bottom of the cavity. The back bias magnet 318 and magnetic flux concentrator 320 are collectively closer in proximity to a zero-magnetic field location 322 than in FIG. 3B, which promotes large signal swings and high precision magnetic field measurements. At the same time, the zero-magnetic field location 322 is aligned on-plane with the upper surfaces 324A, 324B of protrusions 326A, 326B. Thus, this arrangement 300D provides streamlined manufacturing in that a magnetic sensor (not shown) can be reliably positioned on plane with protrusion upper surfaces 324A, 324B—which promotes ease of manufacture. Further, at this position, the magnetic sensor 300D is subject to large magnetic signal swings—which promotes reliable magnetic field sensing. In addition, when the magnetic field concentrator 322 is made of a soft magnetic material (e.g., ferrite material), the cost of the overall sensing arrangement 300D can be reduced relative to embodiments where a back-bias magnet is made wholly of the hard magnetic materials, such as a rare earth element, for example.

It will be appreciated that a number of variations are contemplated as falling within the scope of the present disclosure. For example, referring briefly back to FIG. 1, although the magnetic sensing element 108 is illustrated as being centered in the recess 104 with zero x- and y-field components; in other embodiments the magnetic sensing element 108 may be off-center or outside the recess in order to reduce the sensitivity. This may for example be achieved by having the magnetic sensing element 108 moved away from the region with zero x- and y-component along the guide or support formed by protrusions 118a and 118b. Further, an angle of inclination of the flux guidance surface shaped by the recess may in one embodiment be selected from the range between 5° and 65° when taken from the x-axis. In one embodiment, the angle of inclination may be selected between 5° and 40°. In one embodiment, the angle of inclination may be selected between 5° and 20°.

In embodiments described below in more detail, the recess 104 and/or magnetic flux guidance surface 106 may have a pyramid form, a conical form or a polyhedron form. A number of variations are now described with respect to the remaining figures. It will be appreciated that the illustrated and described embodiments can be combined in any number of ways, and are not limited to the illustrated embodiments.

FIGS. 4A-4B show an embodiment wherein the sensor 108 is placed on a support structure (e.g., PCB or semiconductor substrate) over flux guidance surfaces 106a and 106b. For purposes of clarity, FIG. 4A shows only back bias magnet 102, while FIG. 4B shows back bias magnet 102 with magnetic sensing element 108 and magnetic flux concentrator 110. The flux guidance surfaces 106a and 106b are provided at the lateral border of the back bias magnet 102. The magnetic flux concentrator 110 is arranged between the flux guidance surfaces 106a, 106b and the sensor 108. Although FIG. 4B shows an air-gap 120 between the magnetic flux concentrator 110 and sensor 108, the recess 104 may be completely filled with the flux concentrator 110 in other embodiments, thereby "squeezing out" air gap 120.

FIGS. 5A-5B show an embodiment wherein the recess 104 penetrates the back bias magnet 102 in the vertical direction to form a hole in the top and bottom surfaces of back bias magnet 102. The sensor 108 is placed in the embodiment according to FIG. 5B completely within an IC package 122, which may be magnetizable material or non-magnetizable. FIG. 5B shows the recess 104 to have an inclined surface 106 with respect to the vertical direction such that the width in x-direction decreases towards the sensor 106. However, other embodiments may provide other inclinations or no inclination with respect to the vertical direction. The flux concentrator 110 is illustrated as partially filling the recess 104, wherein the amount of filling can depend on the particular implementation.

Figure 6:
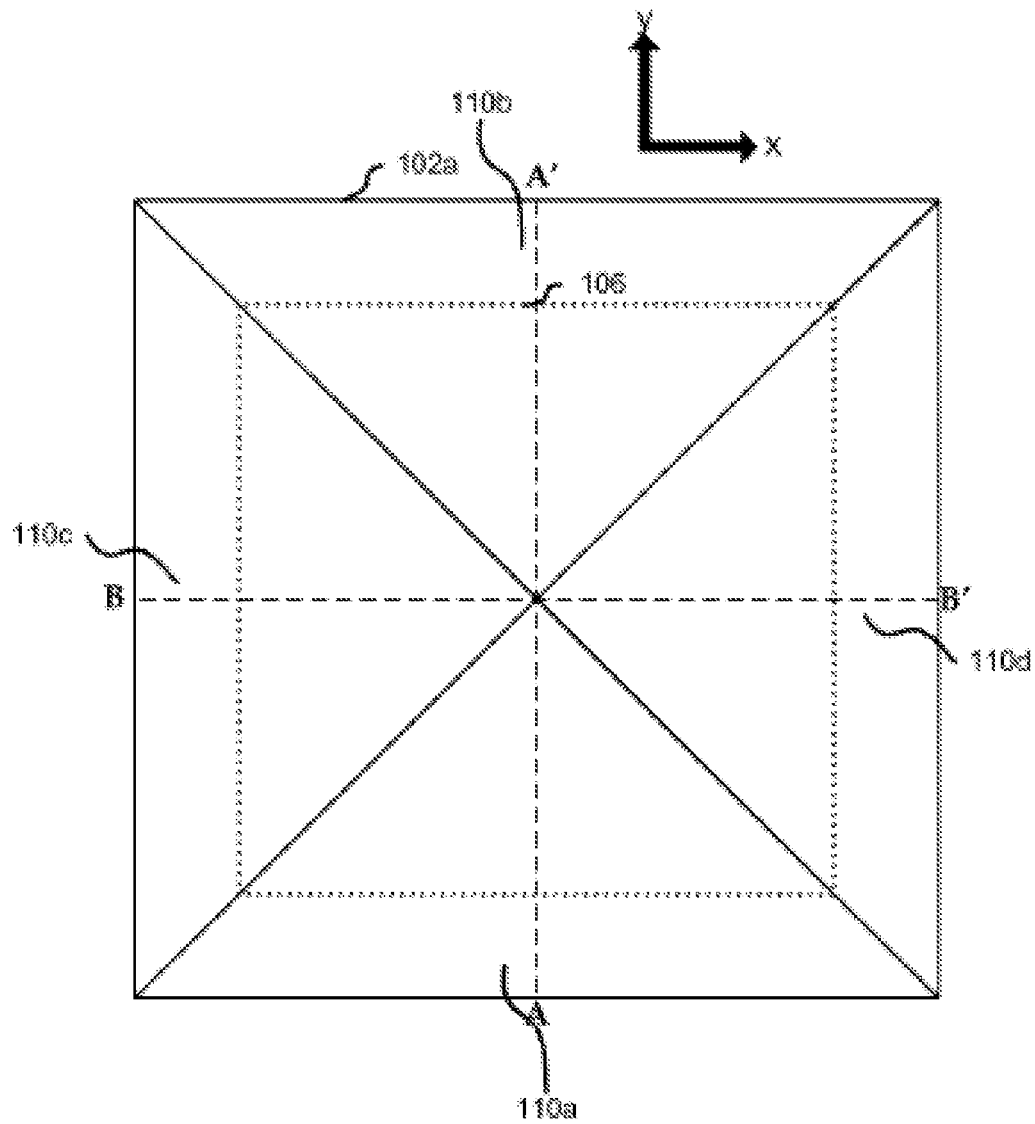
FIGS. 6-8 show top views of magnetoresistive sensors in accordance with some embodiments.
Figure 7:
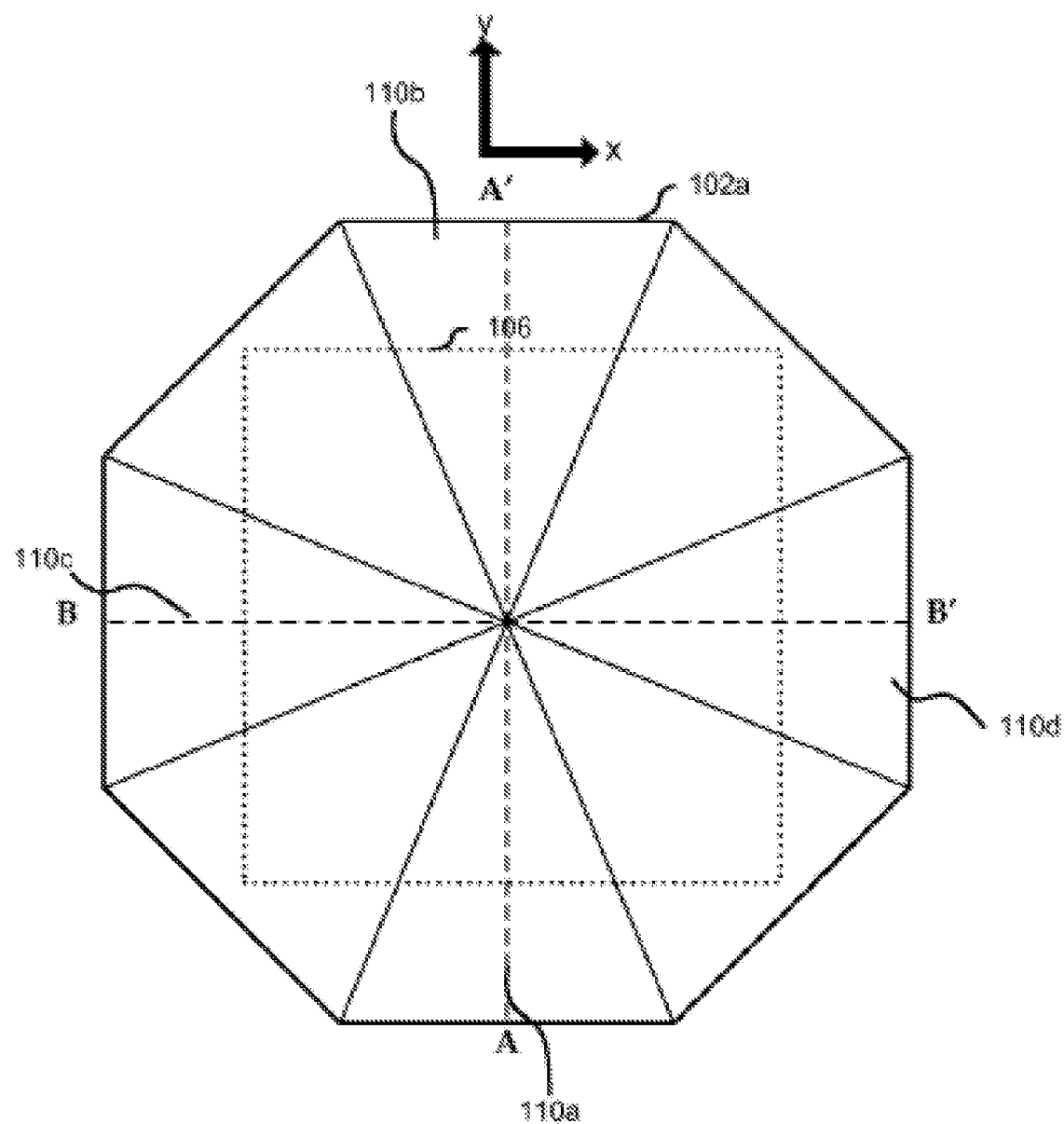
Figure 8:
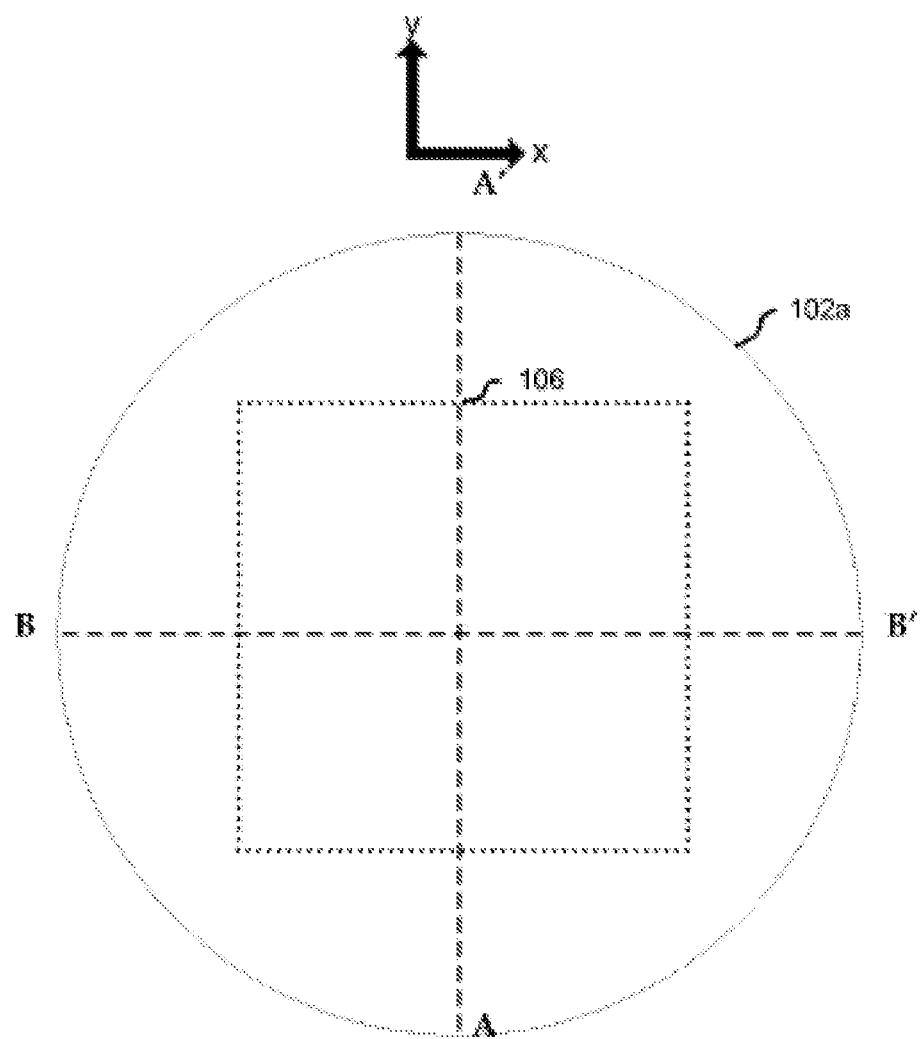

Having now described cross-sectional views of embodiments, FIGS. 6-8 show exemplary top views which may apply to each of the embodiments described with respect to FIGS. 1, 2, 4, and 5. For purposes of simplicity, these top views show only the back bias magnet, and do not show a magnetic flux concentrator formed thereover. However, it will be understood that in practical applications, the magnetic flux concentrator is formed over the back bias magnet.

FIG. 6 shows a top-view of the back bias magnet 102 wherein the recess 104 has a pyramid shape or a shape of half of an octahedron. While FIG. 6 shows the pyramid shape in top-view to have a quadratic form, it may be noted that also a rectangle form with extensions in x and y-direction being different may be provided in embodiments.

FIG. 7 shows a top-view of the back bias magnet 102 wherein the recess 104 has the shape of one half of a polyhedron with 16 surfaces. In embodiments, the recess 104 may have the form of regular polyhedrons or parts of regular polyhedrons.

FIG. 8 shows a top-view of the back bias magnet 102 according to a further embodiment where the recess 104 has a circular form with decreasing radius when moved along the vertical line. In a further embodiment, the recess 104 may have the form of a truncated cone.

Each of the top view forms shown and described with respect to FIGS. 6-8 may be have one of the cross-sectional views shown and described with respect to FIG. 1, 2, 4, or 5. For example, the protrusions shown in FIG. 1 may be provided for the pyramid shape as shown and described with respect to FIG. 6, for the polyhedron shape as shown and described with respect to FIG. 7 or for the cone shape as shown and described with respect to FIG. 8.

Each of the embodiments shown in FIGS. 6 to 8 has in the x-y plane a symmetric structure with a defined center of symmetry. For such structures, the region of zero or substantially zero magnetic x- and y-components includes the center of symmetry. However, other embodiments may have a non-symmetric structure when viewed from the top.

In one embodiment, the back bias magnet 102 can be manufactured by molding hard magnetic and/or soft magnetic material. The molding of the back bias magnet 102 with its geometrical shape can be done with mold tools directly on top of the sensor 108 as an additional packaging step. In some embodiments, the back bias magnet 102 and the sensor 108 may be integrated. In some embodiments, the back bias magnet 102 and the sensor 108 may be integrated within a common package which may be formed by molding over the back bias magnet 102 and the sensor 108. In some embodiments, the back bias magnet 102 can be assembled on the sensor 108 with the usage of adhesive glues or only with mechanical clamping mechanism. In some embodiments, the back bias magnet 102 can be assembled with the sensor 106 and fixed with a mold material that is molded around the whole system for example in a thermoplast injection mold process.

Although various embodiments for manufacturing a magnetic sensor have been discussed and illustrated above in the context of magneto resistive sensors, the manufacturing methods and other concepts are also applicable to other types of magnetic sensors. In regard to the various functions performed by the above described components or structures (blocks, units, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A magnetic sensor system, comprising
a magnetic biasing body comprised of a hard magnetic material and including a recess therein, wherein the recess includes at least four planar surfaces which intersect at a single vertex and which are configured to form a magnetic flux guidance for the magnetic biasing body;
a magnetic sensing element arranged to sense changes in magnetic field orientation at a location in or proximate to the recess; and
a soft magnetic material disposed in the recess above the at least four planar surfaces, the soft magnetic material being configured to reduce a magnetic field due to the magnetic biasing body at the location where the changes in magnetic field orientation are sensed by the magnetic sensing element.

2. The sensor system of claim 1, wherein the soft magnetic material is spaced apart from the magnetic sensing element.

3. The sensor system of claim 1, wherein the flux guidance has an inverted pyramidal shape.

4. The sensor system of claim 1, wherein the hard magnetic material comprises a ferrite material.

5. The sensor system of claim 1, wherein the soft magnetic material comprises a ferrite material.

6. The sensor system of claim 1, wherein the hard magnetic material comprises a rare earth material.

7. The sensor system of claim 1, wherein the soft magnetic material is conformally disposed over the flux guidance.

8. The sensor system of claim 1, wherein the soft magnetic material is disposed over less than all of the flux guidance.

9. The sensor system of claim 1, wherein the magnetic biasing body comprises protrusions extending therefrom, wherein the protrusions have respective upper surfaces that lie along a plane.

10. The sensor system of claim 9, wherein the magnetic sensing element is arranged on a support structure bridging the recess and coupled to the upper surfaces.

11. The sensor system of claim 10, wherein the magnetic sensing element is positioned on or adjacent to the plane.

12. The magnetic sensor system of claim 1:
wherein the recess in the magnetic biasing body extends downwardly from an uppermost surface of the magnetic biasing body, between sidewall portions of the magnetic biasing body, and terminates at an upper surface of a lower portion of the magnetic biasing body; and
wherein a thickness of the soft magnetic material is configured to alter the magnetic field due to the magnetic biasing body so the altered magnetic field has a zero magnetic field at the location, and where the location lies on a plane corresponding to the uppermost surface of the magnetic biasing body.

13. The magnetic sensor system of claim 1:
wherein the recess in the magnetic biasing body extends downwardly from an uppermost surface of the magnetic biasing body, between sidewall portions of the magnetic biasing body, and terminates at an upper surface of a lower portion of the magnetic biasing body; and
wherein the thickness of the soft magnetic material is configured to alter the magnetic field of the magnetic biasing body so the altered magnetic field has a zero magnetic field at the location, and wherein the location is in the recess over an upper surface of the soft magnetic material.

14. An apparatus, comprising:
a magnetic biasing body including a recess therein, wherein the recess includes at least four planar surfaces that intersect at a single vertex and form a magnetic flux guidance of the magnetic biasing body;
a magnetic sensing element configured to sense changes in magnetic field orientation at a location in or proximate to the recess; and
a magnetic flux concentrator disposed in the recess over the at least four planar surfaces, the magnetic flux concentrator arranged between the magnetic flux guidance and the magnetic sensing element, wherein the magnetic flux concentrator is configured to alter a magnetic field due to the magnetic biasing body such that the altered magnetic field has a zero magnetic field at the location where the changes in magnetic field orientation are sensed by the magnetic sensing element.

15. The apparatus of claim 14, wherein the magnetic biasing body comprises protrusions extending from a base region of the magnetic biasing body, wherein the protrusions have respective upper surfaces that lie along a plane.

16. The apparatus of claim 15, wherein the magnetic sensing element is arranged on or adjacent to the plane and changes its resistance proportional to changes in a magnetic field component in the plane, but is insensitive to changes in a magnetic field component perpendicular to the plane.

17. The apparatus of claim 15, wherein the magnetic biasing body comprises magnetic material having a magnetic hardness that is greater than that of the magnetic flux concentrator.

18. A magnetic sensor system, comprising
a magnetic biasing body comprised of a hard magnetic material, wherein the hard magnetic material includes a conically-shaped recess which defines a tapered sidewall in the magnetic biasing body, wherein the conically-shaped recess extends from a first circular or rounded opening proximate an upper surface of the magnetic biasing body to a second circular or rounded opening proximate a lower surface of the magnetic biasing body, the first circular or rounded opening having a first that is less than a second area of the second circular or rounded opening;
a magnetic sensing element arranged over the upper surface of the magnetic biasing body to sense changes in magnetic field orientation at a location proximate to the conically-shaped recess; and
a soft magnetic material disposed in the conically-shaped recess.

19. The magnetic sensor system of claim 18, wherein the soft magnetic material does not entirely fill the conically-shaped recess.

20. The magnetic sensor system of claim 18, wherein the magnetic sensing element is disposed within an integrated circuit package, and the integrated circuit package has an upper surface in direct contact with a lower surface of the magnetic biasing body and in direct contact with the soft magnetic material in the conically-shaped recess.

\* \* \* \* \*